United States Patent [19]
Collins et al.

[11] Patent Number: 5,222,897
[45] Date of Patent: Jun. 29, 1993

[54] CIRCUIT BOARD INSERTER/EJECTOR SYSTEM

[75] Inventors: Steven W. Collins; Stephen Finnegan, both of Franklin; Erik Nelson, Mendon, all of Mass.

[73] Assignee: EMC Corporation, Hopkington, Mass.

[21] Appl. No.: 861,456

[22] Filed: Apr. 1, 1992

[51] Int. Cl.⁵ ............................................. H01R 13/00
[52] U.S. Cl. ........................................................ 439/157
[58] Field of Search ................................. 439/152–160

[56] References Cited

U.S. PATENT DOCUMENTS

| | | | |
|---|---|---|---|
| D. 261,354 | 10/1981 | Clemens | D8/306 |
| 3,311,863 | 3/1967 | Beale | 339/45 |
| 3,335,386 | 8/1967 | Upton | 439/157 |
| 3,476,258 | 11/1969 | Dorsett | 439/157 |
| 3,944,311 | 3/1976 | Sprenkle et al. | 439/157 |
| 4,223,934 | 9/1980 | Cauceglia et al. | 294/15 |
| 4,243,283 | 1/1981 | McSparran | 439/157 |
| 4,480,885 | 11/1984 | Coppelman | 339/45 M |
| 4,603,375 | 7/1986 | Miller et al. | 361/399 |
| 4,633,350 | 12/1986 | Hanson | 360/98 |
| 4,638,405 | 1/1987 | Smith | 361/399 |
| 4,778,401 | 10/1988 | Boudreau et al. | 439/153 |
| 4,840,570 | 6/1989 | Mann, Jr. et al. | 439/74 |
| 4,872,853 | 10/1989 | Webster | 439/327 |
| 4,896,397 | 1/1990 | Elliott | 16/114 R |
| 4,896,777 | 1/1990 | Lewis | 211/41 |
| 4,941,841 | 7/1990 | Darden et al. | 439/377 |
| 4,996,631 | 2/1991 | Freehauf | 361/415 |
| 4,999,744 | 3/1991 | Blankenship | 361/415 |
| 5,025,336 | 6/1991 | Morehouse et al. | 360/97.02 |
| 5,031,074 | 7/1991 | Ravid | 361/413 |

Primary Examiner—Joseph H. McGlynn
Attorney, Agent, or Firm—Weingarten, Schurgin, Gagnebin & Hayes

[57] ABSTRACT

An inserter/ejector system for use in inserting a circuit board into a backplane in a chassis and for ejecting the circuit board from the backplane in the chassis. The inserter/ejector system may be used in conjunction with staggered height connector pins to permit the circuit board to be inserted into or removed from the backplane without removing power to the backplane.

9 Claims, 7 Drawing Sheets

# CIRCUIT BOARD INSERTER/EJECTOR SYSTEM

FIELD OF THE INVENTION

The invention relates to the field of circuit boards and more particularly to the field of circuit board inserters and ejectors.

BACKGROUND OF THE INVENTION

In many electronics systems, including computer systems, a large number of electronic components, which make up the system, generally are arranged on one or more circuit boards or cards. Typically these circuit boards are arranged in parallel within a chassis. A backplane, upon which a number of connectors are located, closes one end of the chassis. When the circuit boards are in place within the chassis, the backplane connectors supply signal, electrical power and ground connections to each of the circuit boards.

For the backplane connector to supply power and signals to the circuit board, each circuit board has a circuit board connector. Each circuit board connector has contact pins which engage corresponding contact pins within the connectors of the backplane. The pins within each backplane connector tightly grip the pins on the corresponding circuit board connector of the circuit board and a good deal of force is required to engage or disengage the circuit board connector of the circuit board and the connectors of the backplane.

Typically, each circuit board has one or more inserter/ejector levers located at a corner at the outer edge of the circuit board. In a two lever system, a first lever engages one surface of the chassis while a second lever engages a second surface of the chassis. Such levers reduce the amount of effort required to force the pins of the circuit board connector of the circuit board into the backplane connector. Conversely, the levers reduce the amount of effort required to pull the pins of the circuit board connector of the circuit board from the backplane connector. Also typically these levers are constructed to facilitate the entry and withdrawal of the circuit board in a single motion.

The present invention relates to a circuit board inserter/ejector system which first acts to align the circuit board circuit board connectors with the connectors of a backplane and once alignment has occurred, provides the mechanical advantage to ease the insertion (and removal) of the circuit board circuit board connectors into the backplane connectors.

SUMMARY OF THE INVENTION

The invention relates to an inserter/ejector system for use in inserting a circuit board into a backplane in a chassis and for use in ejecting the circuit board from the backplane in the chassis. The inserter/ejector of the inserter/ejector system includes an inserter/ejector lever which is attached to the circuit board and is pivotable between two orientations. The inserter/ejector lever includes a chassis engagement portion which is capable of engaging an opening in the base of the chassis. The chassis engagement portion includes a positive stop which, in a third orientation of the inserter/ejector lever, prevents the circuit board from being inserted further into the chassis. The positive stop is positioned such that a circuit board connector on the circuit board is aligned with, yet prevented from engaging with, a backplane connector on the backplane of the chassis. When the inserter/ejector lever is rotated into the second orientation, the circuit board is inserted further into the chassis and the circuit board connector on the circuit board engages the backplane connector.

BRIEF DESCRIPTION OF THE DRAWINGS

Other features and benefits of the invention can be more clearly understood with reference to the specification and the accompanying drawings in which.

DESCRIPTION OF THE PREFERRED EMBODIMENT

Figure 1:
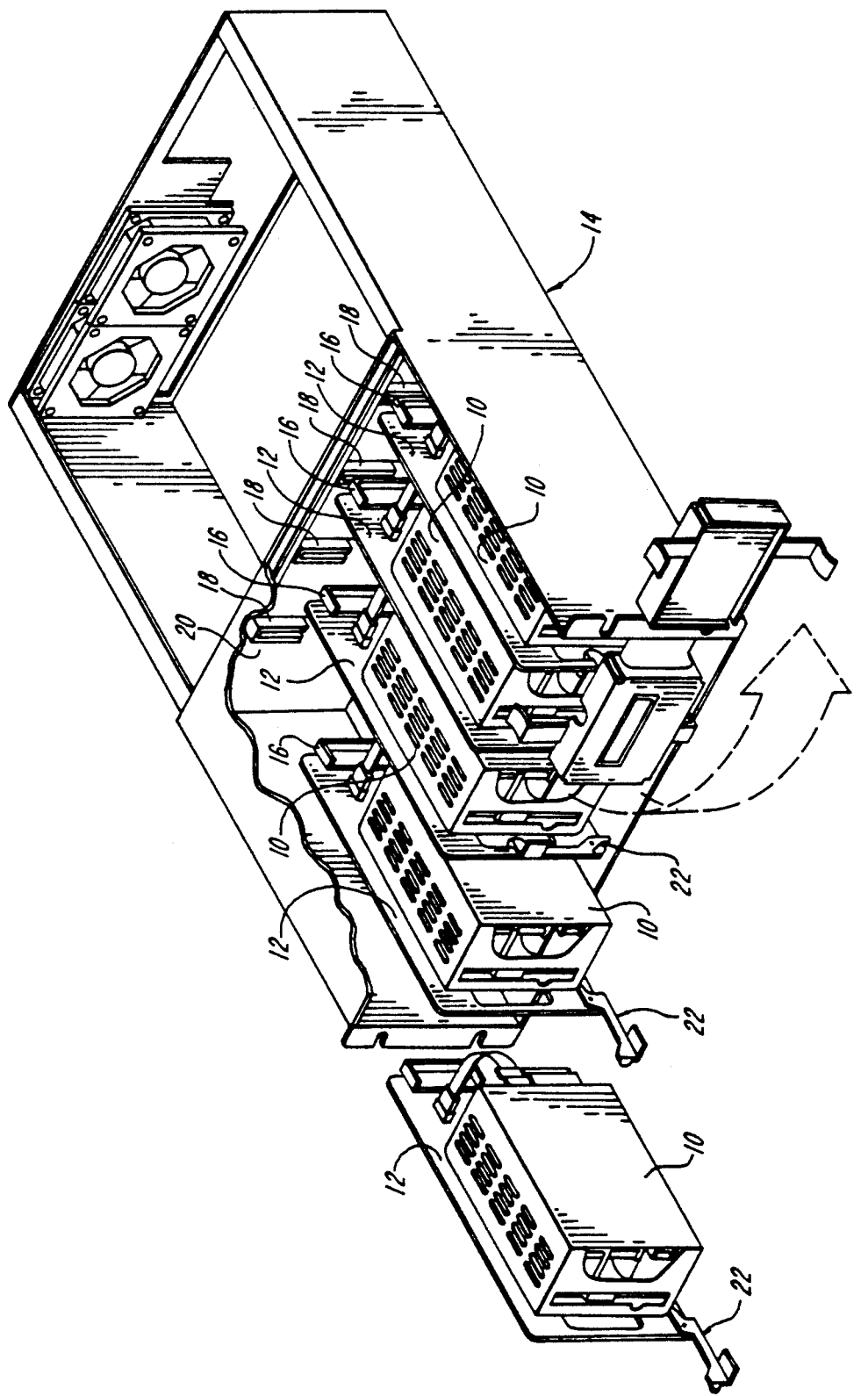
FIG. 1 is a perspective view of an embodiment of a chassis and circuit board of the inserter/ejector system of the invention.

In brief overview, an electronic system utilizing an embodiment of the inserter/ejector system of the invention is shown in FIG. 1. In the electronic system shown, a series of magnetic disk drives 10, each mounted on a circuit board 12, are disposed in a chassis 14. Each circuit board 12 includes a circuit board connector 16 at one edge of the circuit board 12 by which ground, signals and power are supplied to the magnetic disk drive 10 on the circuit board 12. The circuit board connector 16 of the circuit board 12 engages a respective connector 18 in a backplane 20 located at one end of the chassis 14.

At the opposite end from the end connector 16 on each circuit board 12 is an inserter/ejector lever 22. The inserter/ejector lever 22 is pivotally mounted to the circuit board 12 and configured to aid in inserting the circuit board 12 into the chassis 14 and in removing the circuit board 12 from the chassis 14.

Figure 2A:
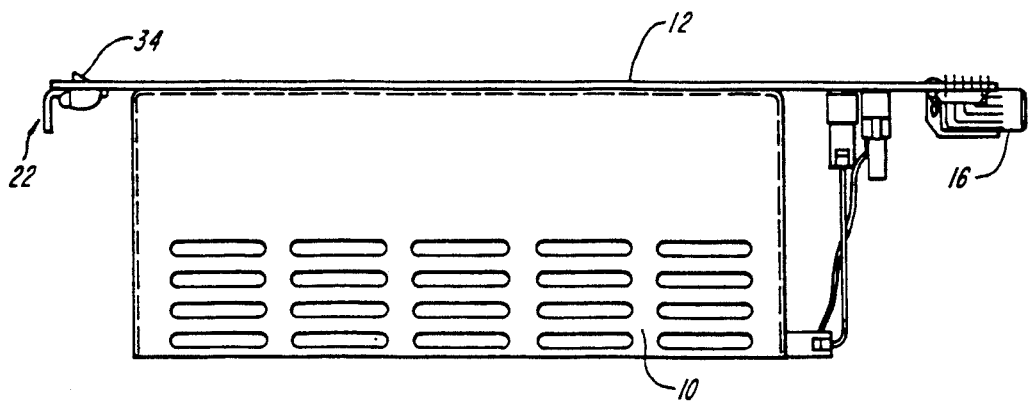
FIG. 2A is a side view of the embodiment of the circuit board with the inserter/ejector lever shown in FIG. 2.
Figure 2:
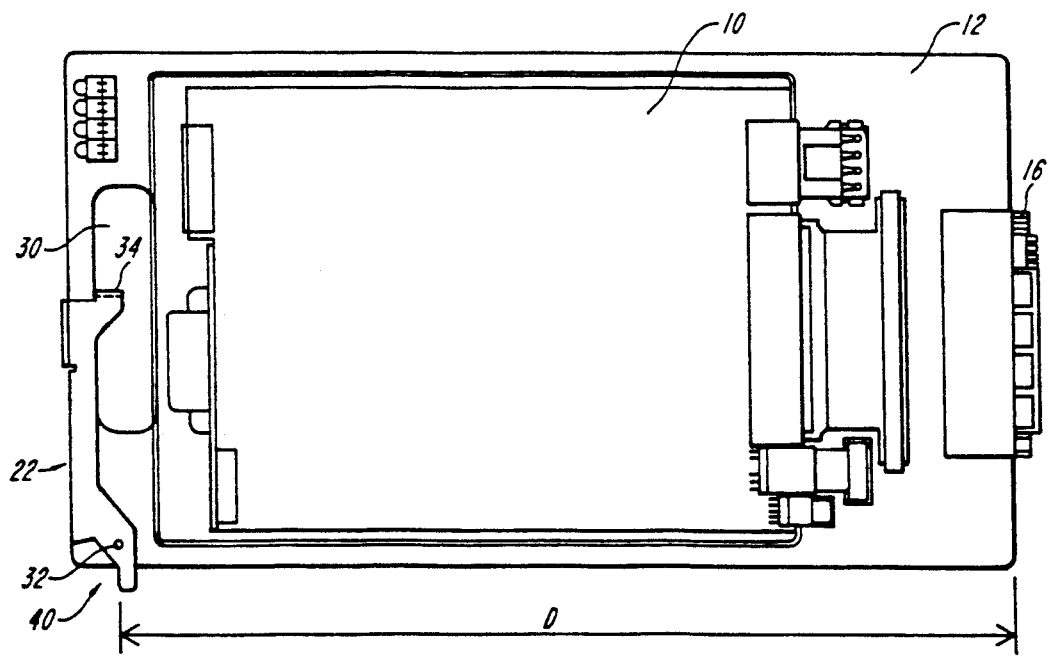
FIG. 2 is a plan view of the embodiment of the circuit board with the inserter/ejector lever of the inserter/ejector system shown in FIG. 1.

Referring to FIGS. 2 and 2A, an embodiment of a circuit board 12 including an embodiment of the inserter/ejector lever 22 of the invention is shown as a carrier for a magnetic disk drive 10, although the invention is not restricted solely to a circuit board 12 used for this function. The circuit board 12 depicted includes an opening 30, which functions as a handle, at the opposite edge of the circuit board 22 from that at which the circuit board connector 16 is mounted. The inserter/ejector lever 22 is mounted to a pivot pin 32 adjacent one corner of the circuit board 12, also opposite the edge of the circuit board 12 to which the circuit board connector 16 is attached. The inserter/ejector lever 22 is movable between a substantially horizontal position which is approximately parallel to the insertion direction of the circuit board 12 and a substantially vertical position, as shown in FIG. 2, which is approximately perpendicular to the insertion direction of the circuit board 12. A locking tang 34 on the inserter/ejector lever 22 engages the opening 30 in the circuit board 12 to lock the inserter/ejector lever 22 in the vertical position.

Figure 3B:
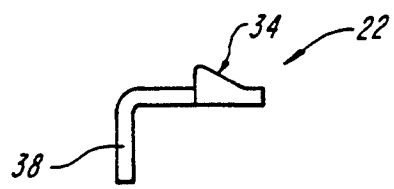
FIG. 3B is a top view of the embodiment of the inserter/ejector lever shown in FIG. 3.
Figure 3A:
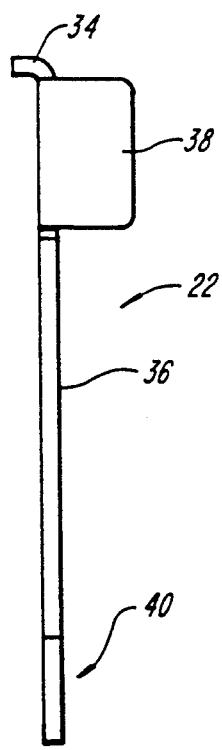
FIG. 3A is a side view of the embodiment of the inserter/ejector lever shown in FIG. 3.
Figure 3:
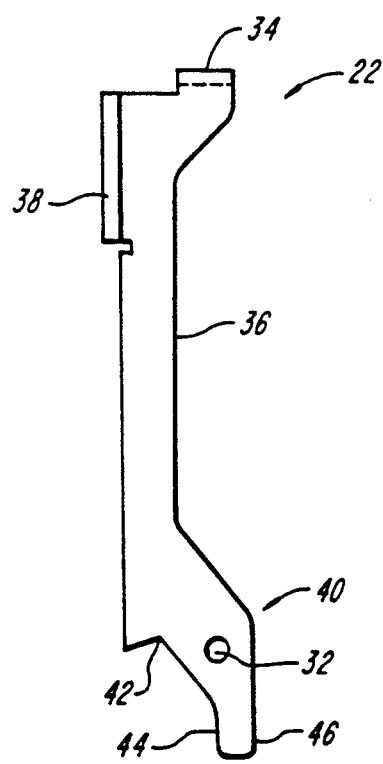
FIG. 3 is a plan view of the embodiment of the inserter/ejector lever shown in FIG. 2.

Referring to FIGS. 3, 3A and 3B, an embodiment of the inserter/ejector lever 22, in addition to the locking tang 34, includes a lever arm 36, a thumb plate 38, and a chassis engagement portion 40. The thumb plate 38 provides a surface with which the lever arm 36 can be rotated to the vertical position from the horizontal position. In addition, the thumb plate 38 provides a gripping surface by which the locking tang 34 can be disengaged from the opening 30, in order to rotate the inserter/ejector level to its horizontal orientation. The chassis engagement portion 40 includes a positive stop 42, an insertion camming surface 44 and an ejection camming surface 46. The inserter/ejector lever 22 is positioned on the pivot 32 at a distance (D) (FIG. 2) from the circuit board connector 16. The distance (D) is chosen such that when the circuit board 12 is fully inserted in the chassis 14 and the inserter/ejector 22 is in its vertical position, the chassis engagement portion 40 is engaged in an opening 50 in the base 52 (FIG. 4) of the chassis 14 and the circuit board connector 16 is fully engaged in the backplane connector 18.

Figure 4:
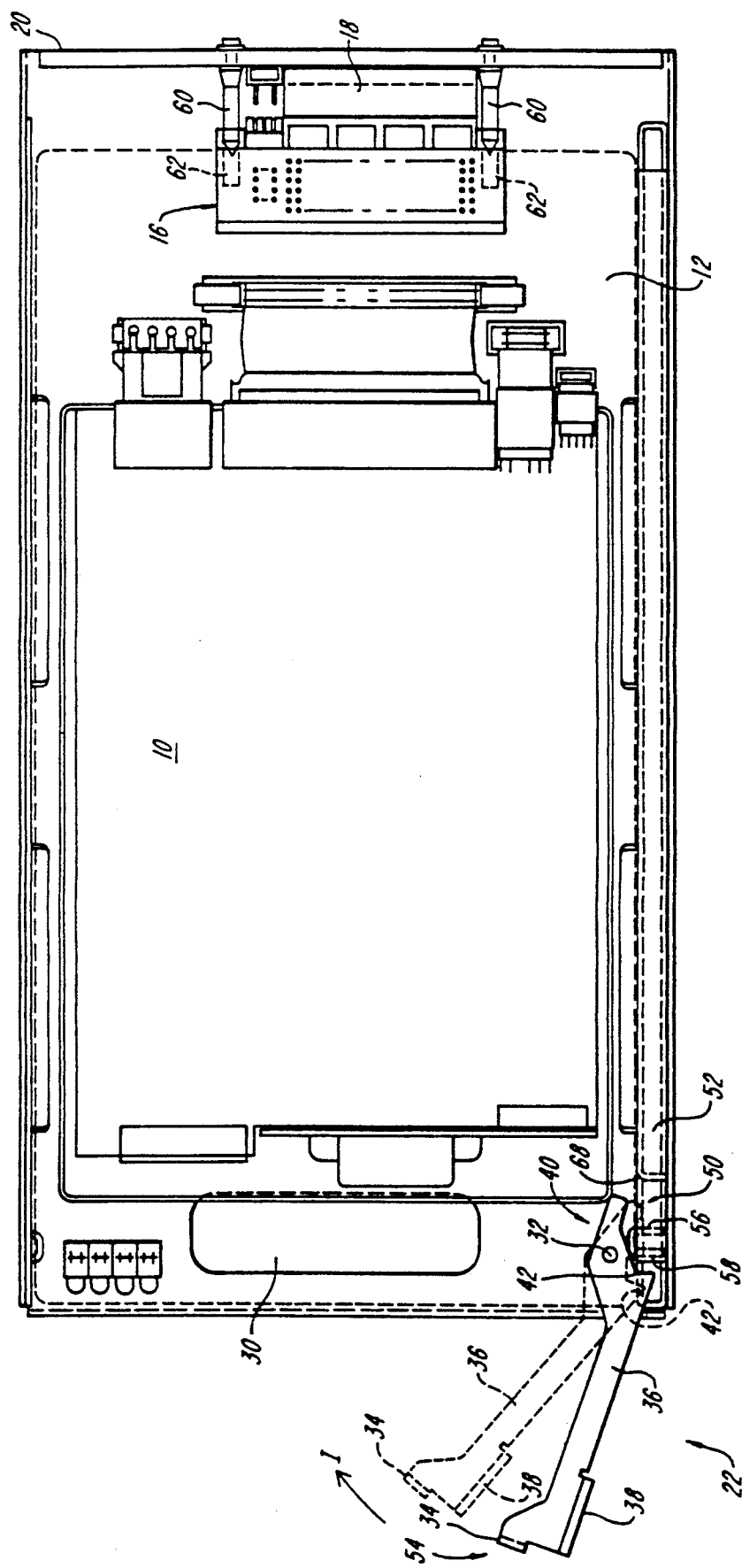
FIG. 4 is a plan view of the embodiment of the circuit board with the inserter/ejector lever shown in FIG. 3 positioned to engage the base of the chassis.

To understand the various relationships between the structures of the chassis 14, the circuit board 12 and the inserter/ejector lever 22, it is best to consider the operation of the device. Referring also to FIG. 4, the chassis 14 includes an opening 50 in its base 52 which is engagable by the chassis engagement portion 40 of the inserter/ejector lever 22. The inserter/ejector lever 22 is positioned approximately horizontally (shown as position 54) and the circuit board 12 is inserted into the chassis 14. The circuit board 12 moves forward into the chassis 14, until the positive stop 42 of the inserter/ejector lever 22 makes contact with an edge 58 at the base of the chassis 14. At this point, alignment pins 60 of the backplane connector 18 engage the alignment holes 62 of circuit board connector 16, and the circuit board connector 16 is aligned with the backplane connector 18.

Figure 4A:
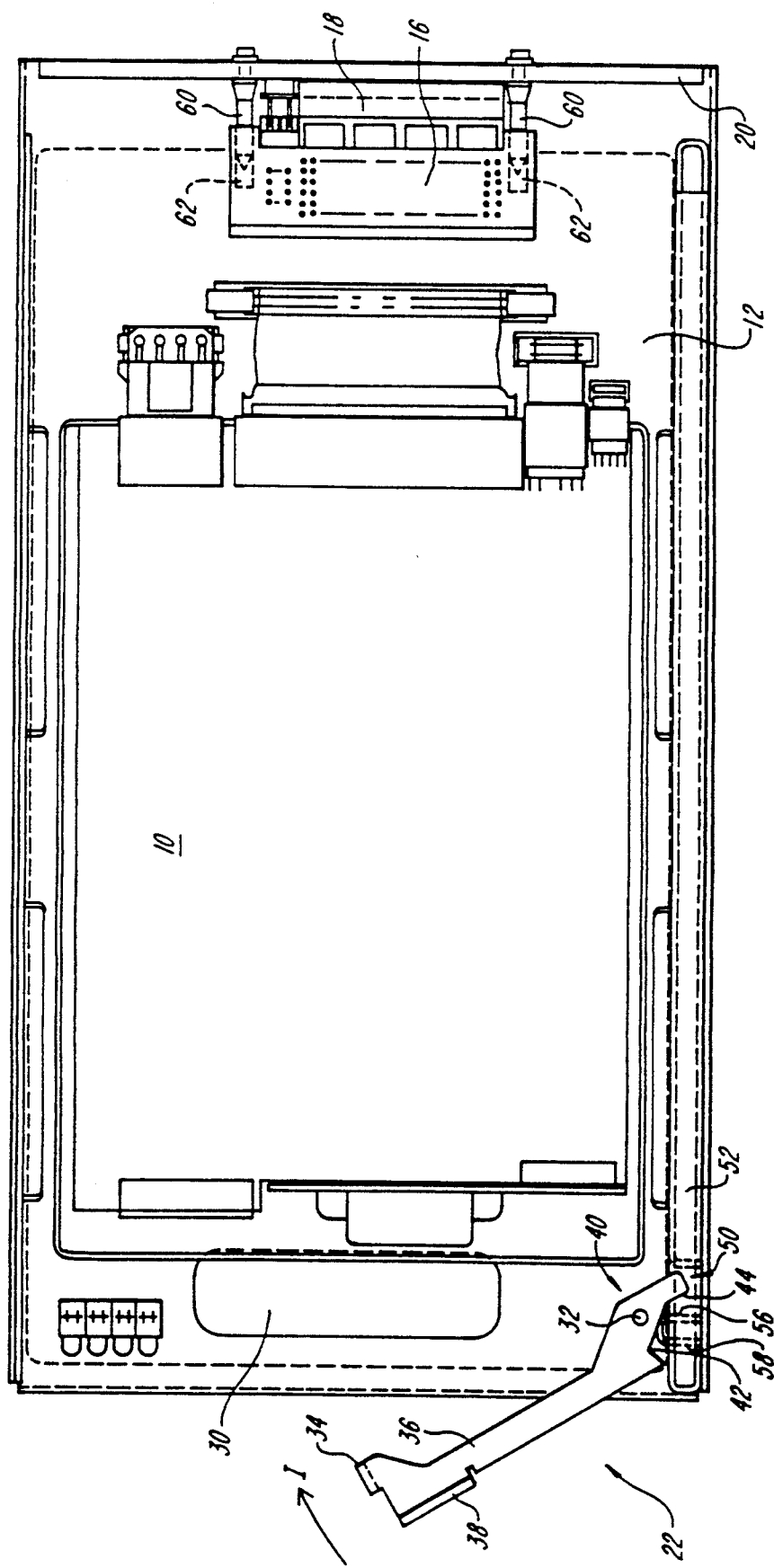
FIG. 4A is a plan view of the embodiment of the circuit board with the inserter/ejector lever shown in FIG. 4 engaging the base of the chassis and with alignment holes of a connector of the circuit board engaging the alignment pins of a connector of the backplane.
Figure 4B:
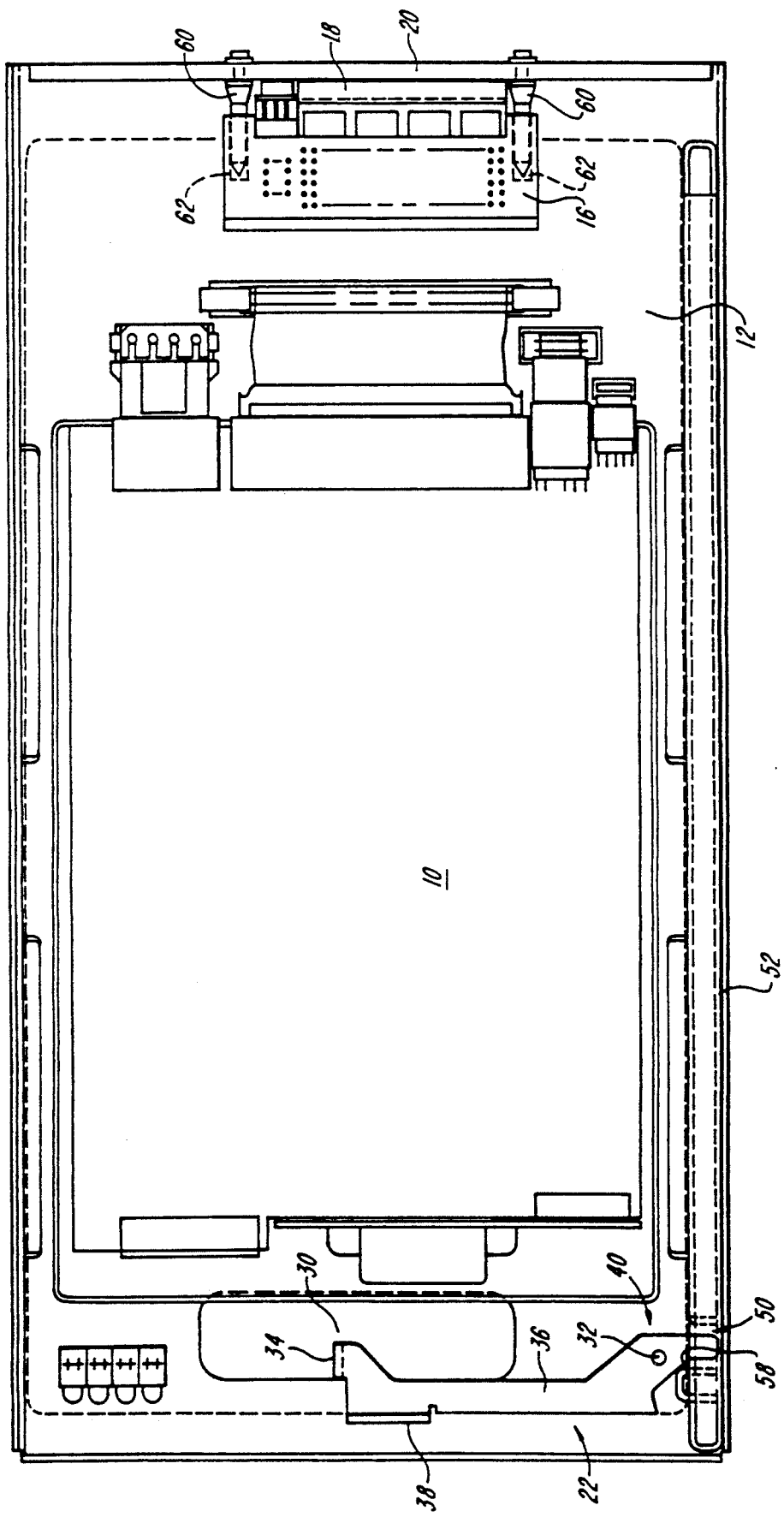
FIG. 4B is a plan view of the embodiment of the circuit board with the inserter/ejector lever shown in FIG. 4 fully engaging the base of the chassis and with the connector of the circuit board fully engaging the connector of the backplane.

As the inserter/ejector lever 22 is rotated (arrow I) toward the vertical position, the positive stop 42 no longer engages edge 58 and the circuit board 12 is permitted to travel into the chassis 14. Referring to FIG. 4A, as the inserter/ejector lever 22 is rotated (arrow I) toward vertical, insertion camming surface 44 engages a rear edge surface 56 of the hole 50 and acts to lever the circuit board 12 forward into the chassis 14. This causes circuit board connector 16 to begin to engage the backplane connector 18. Referring to FIG. 4B, when the inserter/ejector lever 22 is vertical, the locking tang 34 engages the forward edge of hole 30 and the circuit board connector 16 completely engages the backplane connector 18.

Figure 4C:
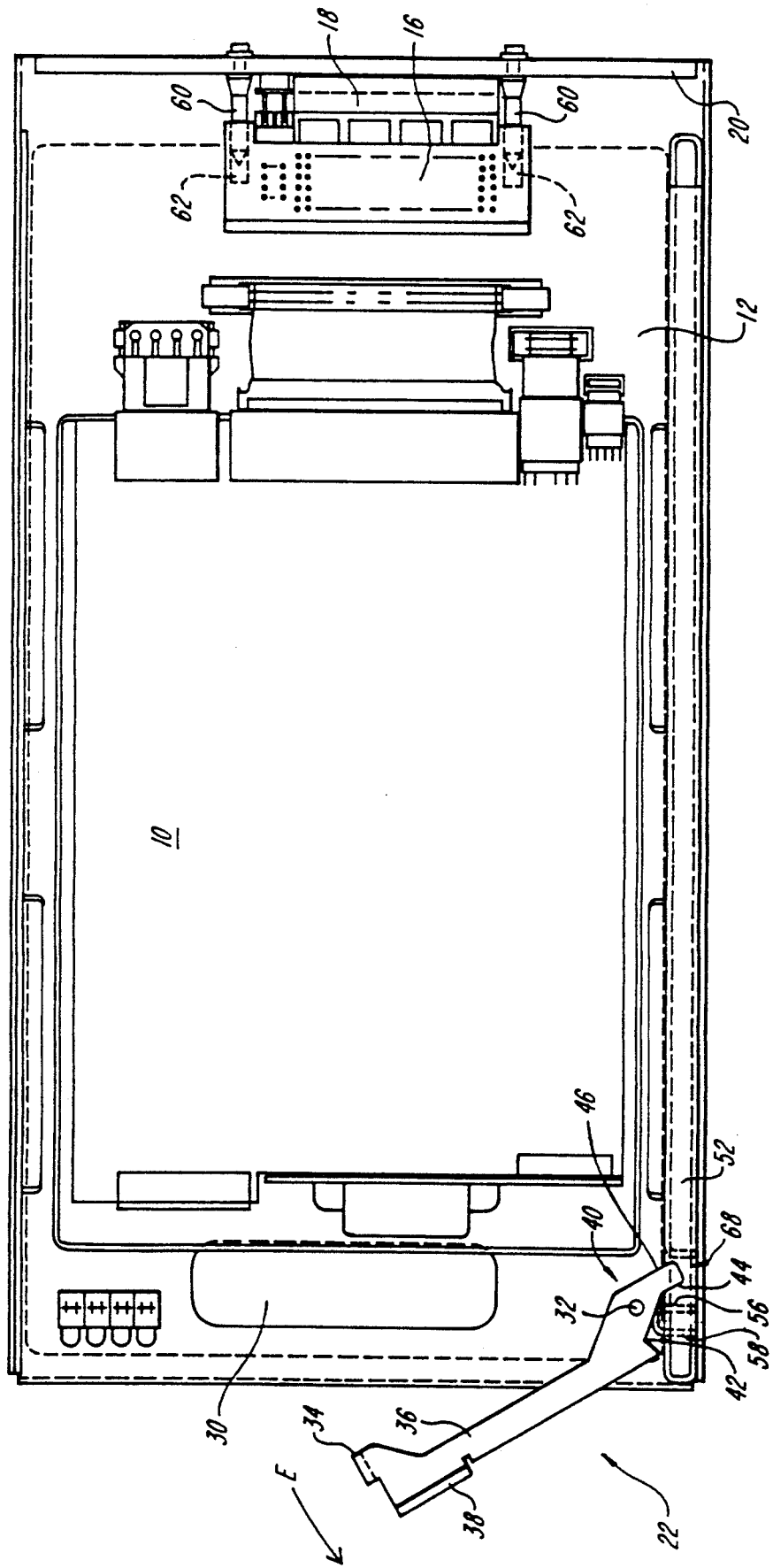
FIG. 4C is a plan view of the embodiment of the circuit with the inserter/ejector lever shown in FIG. 4 engaging the base of the chassis and with a connector of the circuit board disengaging the connector of the backplane.

Referring to FIG. 4C, to remove the circuit board 12 from chassis 14, the locking tang 34 is first disengaged from the forward edge of the hole 30 and the insertion/ejection lever 22 is rotated away (arrow E) from the circuit board 12. The ejection camming surface 46 engages a forward edge surface 68 of hole 50, levering the circuit board 12 rearward and out of the chassis 14 and causing circuit board connector 16 to disengage the backplane connector 18.

With the proper ratio of length of card engagement portion 40 to length of lever arm 36, a significant mechanical advantage can be realized. In the embodiment shown, the ratio of lever arm 36 to card engagement portion 40 is about 6.4.

It should also be noted that by using a circuit board connector 16 having staggered length pins, it is possible to use the invention to insure the proper order of pin engagement so as to permit a circuit board 12 to be inserted into a chassis 14 with the power on. This is done by having the pin which is to make contact first, for example the ground pin, be of a length such that it engages the corresponding pin in the backplane connector 18 immediately after the alignment pins 60 of the backplane connector 18 engage the alignment holes 62 of the circuit board connector 16. The use of the positive stop 42 provides a way to absorb the shock of board insertion and to permit the circuit board circuit board connector 16 to align with the backplane connector 18 before pressure is applied to force the connectors 16 and 18 together.

Thus, the insertion-ejection system of the invention eases and smooths the insertion of a circuit board into a chassis in a manner which reduces shock and vibration which might otherwise harm a device, such as a magnetic disk drive, mounted upon the circuit board.

These and other examples of the concept of the invention illustrated above are intended by way of example and the actual scope of the invention is to be determined solely from the following claims.

We claim:

1. A circuit board inserter/ejector system comprising:
   a chassis having a forward end, said chassis comprising:
      a horizontal surface having an engagement hole and a horizontal surface stop; and
      a backplane oriented perpendicular to said horizontal surface and enclosing said forward end of said chassis, said backplane comprising a backplane connector; and
   a circuit board comprising:
      a circuit board connector mounted on said circuit board; and
      an inserter/ejector lever pivotally mounted on said circuit board, said inserter/ejector lever comprising a lever arm and a chassis engagement portion, said chassis engagement portion comprising a positive stop,
   said inserter/ejector lever being pivotable between a first orientation and a second orientation, and being positioned on said circuit board such that when said inserter/ejector is in said second orientation, and said circuit board is fully positioned within said chassis, said circuit board connector is fully engaged with said backplane connector, and said chassis engagement portion protrudes through said engagement hole in said horizontal surface of said chassis, and when said inserted/ejector lever is in said first orientation, said positive stop engages said horizontal surface stop, said circuit board is prevented from moving further into said chassis and said circuit board connector is aligned with but prevented from engaging said backplane connector, said inserter/ejector permitting said circuit board to move further into said chassis upon the disengagement of said positive stop from said horizontal surface stop by the movement of said inserter/ejector lever from said first orientation to said second orientation.

2. The circuit board inserter/ejector system of claim 1 wherein said first orientation is substantially parallel to a direction of insertion of said circuit board into s id chassis and said second orientation is substantially perpendicular to said horizontal surface of said chassis.

3. The circuit board inserter/ejector system of claim 1 wherein said chassis engagement portion comprises a insertion camming surface and an ejection camming surface and wherein inserter/ejector lever is pivotable to a third orientation intermediate said first orientation and said second orientation, wherein when said inserter/ejector lever is pivoted to said third orientation from said first orientation, said insertion camming surface engages said engagement hole thereby leveraging said circuit board into said chassis, and wherein when said inserter/ejector lever is pivoted to said third orientation from said second orientation, said ejection camming surface engage said engagement hole thereby leveraging said circuit board out of said chassis.

4. The circuit board inserter/ejector system of claim 1 wherein when said inserter/ejector lever is in said first orientation, and said positive stop engages said horizontal surface stop, said positive stop acts to absorb the shock of engagement between said circuit board connector and said backplane connector.

5. A circuit board comprising:
 a circuit board connector mounted on said circuit board; and
 an inserter/ejector lever pivotally mounted on said circuit board, said inserter/ejector lever comprising a lever arm and a chassis engagement portion, said chassis engagement portion comprising a positive stop,
 said inserter/ejector lever being pivotable between a first orientation and a second orientation, and being positioned on said circuit board such that when said inserter/ejector is in said second orientation, and said circuit board is fully positioned within a chassis having a horizontal surface and an end enclosed by a backplane having a backplane connector, said circuit board connector is fully engaged with said backplane connector and said chassis engagement portion protrudes through an engagement hole in said horizontal surface of said chassis, and
 when said inserter/ejector lever is in said first orientation, said positive stop engages a portion of said horizontal surface stop, said circuit board is prevented from moving further into said chassis and said circuit board connector is aligned with but prevented from engaging said backplane connector,
 said inserter/ejector permitting said circuit board to move further into said chassis upon the disengagement of said positive stop from said horizontal surface stop by the movement of said inserter/ejector lever from said first orientation to said second orientation.

6. The circuit board of claim 5 wherein said first orientation is substantially parallel to a direction of insertion of said circuit board into said chassis and said second orientation is substantially perpendicular to said horizontal surface of said chassis.

7. The circuit board system of claim 5 wherein said chassis engagement portion comprises a insertion camming surface and an ejection camming surface and wherein inserter/ejector lever is pivotable to a third orientation intermediate said first orientation and said second orientation, wherein when said inserter/ejector lever is pivoted to said third orientation from said first orientation, said insertion camming surface engage said engagement hole thereby leveraging said circuit board into said chassis, and wherein when said inserter/ejector lever is pivoted to said third orientation from said second orientation, said ejection camming surface engages said engagement hole thereby leveraging said circuit board out of said chassis.

8. The circuit board system of claim 5 wherein when said inserter/ejector lever is in said first orientation, and said positive stop engages said horizontal surface stop, said positive stop acts to absorb the shock of engagement between said circuit board connector and said backplane connector.

9. A disk drive system comprising:
 a circuit board comprising:
  a circuit board connector mounted on said circuit board;
  an inserter/ejector lever pivotally mounted on said circuit board, said inserter/ejector lever comprising a lever arm, a chassis engagement portion comprising a positive stop, an insertion camming surface and an ejection camming surface; and
  a disk drive mounted to said circuit board,
 said inserter/ejector lever being pivotable between a first orientation substantially parallel to a direction of insertion of said circuit board into a chassis having a horizontal surface and a backplane comprising a backplane connector, and a second orientation substantially perpendicular to said horizontal surface of said chassis,
 said inserter/ejector lever being positioned on said circuit board such that when said inserter/ejector is in said second orientation and said circuit board is fully positioned within said chassis, said circuit board connector is fully engaged with said backplane connector, and said chassis engagement portion protrudes through an engagement hole in said horizontal surface of said chassis,
 when said inserter/ejector lever is in said first orientation, said positive stop engages said horizontal surface stop, circuit board is prevented from moving further into said chassis and said circuit board connector is aligned with but prevented from engaging said backplane connector,
 said inserter/ejector permitting said circuit board to move further into said chassis upon the disengagement of said positive stop from said horizontal surface stop by the movement of said inserter/ejector lever from said first orientation to said second orientation.

* * * * *

UNITED STATES PATENT AND TRADEMARK OFFICE
CERTIFICATE OF CORRECTION

PATENT NO. : 5,222,897
DATED : June 29, 1993
INVENTOR(S) : Steven W. Collins et al.

It is certified that error appears in the above-indentified patent and that said Letters Patent is hereby corrected as shown below:

Column 5, line 15, "s id" should read --said--.

Column 5, line 31, "engage" should read --engages--.

Column 6, line 17, "engage" should read --engages--.

Signed and Sealed this

Nineteenth Day of April, 1994

Attest:

BRUCE LEHMAN

Attesting Officer     Commissioner of Patents and Trademarks